United States Patent
Ko

(10) Patent No.: US 12,272,559 B2
(45) Date of Patent: Apr. 8, 2025

(54) OBLIQUE DEPOSITION AND ETCH PROCESSES

(71) Applicant: Tokyo Electron Limited, Tokyo (JP)

(72) Inventor: Akiteru Ko, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 436 days.

(21) Appl. No.: 17/735,800

(22) Filed: May 3, 2022

(65) Prior Publication Data

US 2022/0392771 A1    Dec. 8, 2022

Related U.S. Application Data

(60) Provisional application No. 63/195,757, filed on Jun. 2, 2021.

(51) Int. Cl.
| | |
|---|---|
| *H01L 21/308* | (2006.01) |
| *H01L 21/027* | (2006.01) |
| *H01L 21/033* | (2006.01) |
| *H01L 21/311* | (2006.01) |
| H01L 21/3065 | (2006.01) |

(52) U.S. Cl.
CPC ...... *H01L 21/3086* (2013.01); *H01L 21/0273* (2013.01); *H01L 21/0274* (2013.01); *H01L 21/0337* (2013.01); *H01L 21/31144* (2013.01); H01L 21/3065 (2013.01)

(58) Field of Classification Search
CPC ............. H01L 21/3086; H01L 21/0273; H01L 21/0274; H01L 21/0337
See application file for complete search history.

(56) References Cited

U.S. PATENT DOCUMENTS

| | | |
|---|---|---|
| 2013/0273711 A1 | 10/2013 | Liu et al. |
| 2018/0374701 A1 | 12/2018 | Chen et al. |
| 2019/0157084 A1 | 5/2019 | Huang et al. |
| 2020/0048759 A1 | 2/2020 | Shinada et al. |
| 2020/0335340 A1 | 10/2020 | Huang et al. |
| 2021/0013048 A1 | 1/2021 | Liu et al. |
| 2021/0305048 A1 | 9/2021 | Ko |
| 2021/0375684 A1 | 12/2021 | Yamaguchi et al. |

OTHER PUBLICATIONS

Chen et al., "Tip-to-tip cariation mitigation in extreme ultraviolet lithography for 7nm and beyond metallization layers and design rule analysis," Journal of Vacuum Science & Technology B, Nanotechnology and Microelectronics: Materials, Processing, Measurement, and Phenomena, Nov. 21, 2017, 11 pages.

International Searching Authority, "Notification of Transmittal of the International Search Report and the Written Opinion of the International Seaching Authority, or the Declaration," International Application No. PCT/US2022/028680, dated Sep. 7, 2022, 11 pages.

*Primary Examiner* — Joseph C. Nicely
(74) *Attorney, Agent, or Firm* — Slater Matsil, LLP

(57) ABSTRACT

A method of processing a substrate that includes receiving a patterned photoresist formed over a substrate, the patterned photoresist defining initial openings, each of the initial openings including a first side and an opposite second side along a first direction; depositing a mask material preferentially on the first side within the initial openings using an oblique deposition process performed at a first angle inclined from the first side; and removing a portion of the patterned photoresist using an oblique etch process performed at a second angle inclined from the second side, the mask material and a remaining portion of the patterned photoresist defining final openings.

25 Claims, 9 Drawing Sheets

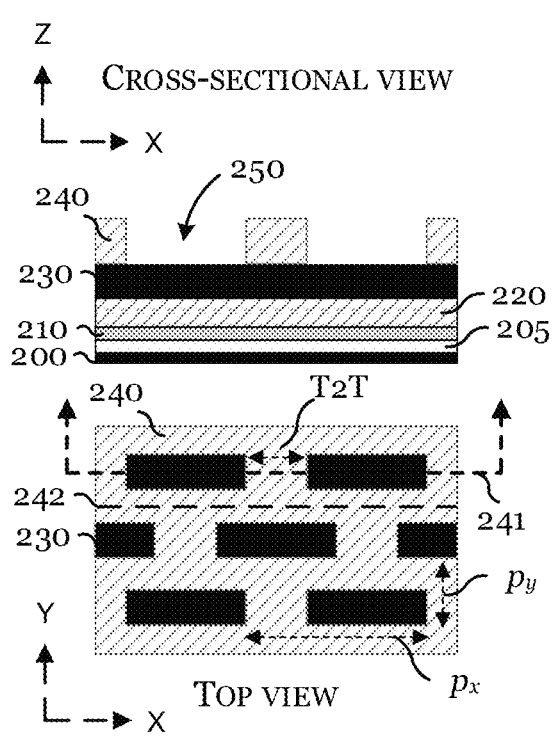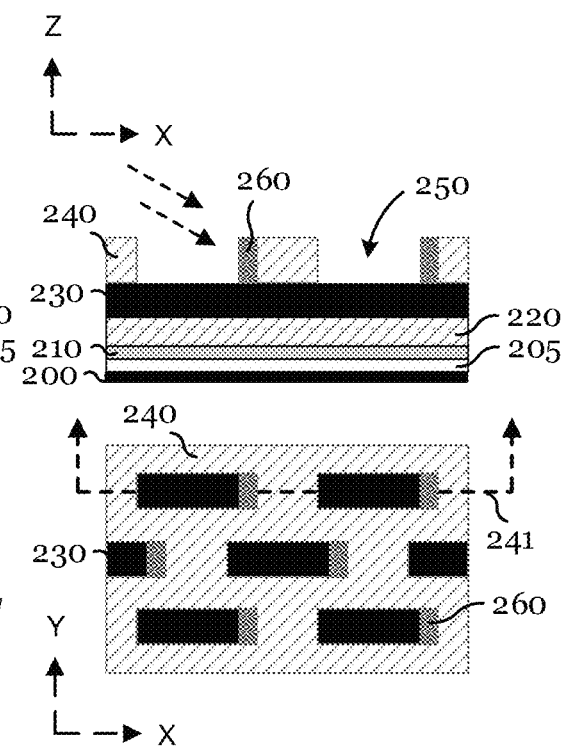
FIG. 2A                FIG. 2B
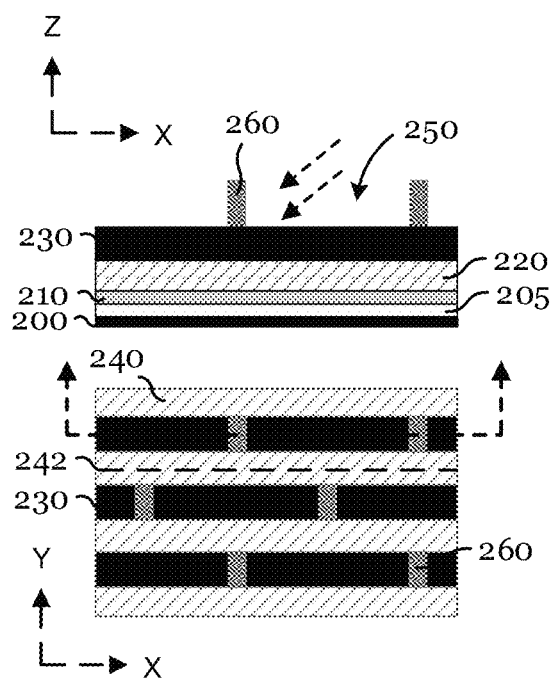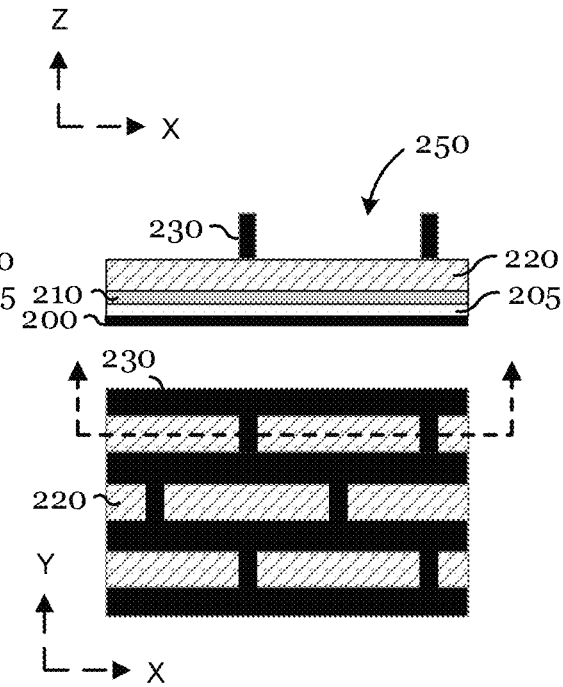
FIG. 2C                FIG. 2D

OBLIQUE DEPOSITION AND ETCH PROCESSES

CROSS-REFERENCE TO RELATED APPLICATIONS

This application claims the benefit of U.S. Provisional Application No. 63/195,757, filed on Jun. 2, 2021, which application is hereby incorporated herein by reference.

TECHNICAL FIELD

The present invention relates generally to a method of processing a substrate, and, in particular embodiments, to oblique deposition and etch processes.

BACKGROUND

Fabricating structures on semiconductor wafers typically involves patterning a photoresist film by lithographic exposure, developing the photoresist film using various chemical developers to generate a relief pattern, and then transferring the relief pattern defined by the resist film into one or more underlying layers using an etch process. The semiconductor industry is constantly advancing electronic devices, which means structures and features on wafers are continually shrinking. Methods of shrinking line-widths in lithographic processes have historically involved using greater-NA optics, shorter exposure wavelengths, or interfacial media other than air (e.g., water immersion). As the resolution of conventional lithographic processes has approached theoretical limits, manufacturers have started to turn to double-patterning (DP) methods to overcome optical limitations.

In material processing methodologies (such as photolithography), creating patterned layers comprises the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithography system. This exposure can then be followed by the removal of irradiated regions of the radiation-sensitive material (as in the case of positive photoresist), or non-irradiated regions (as in the case of negative resist) using a developing solvent. This mask layer may comprise multiple sub-layers.

Conventional lithographic techniques for exposing a pattern of radiation or light onto a substrate have various challenges that limit a size of features exposed, and limit pitch or spacing between exposed features.

SUMMARY

In accordance with an embodiment of the present invention, a method of processing a substrate that includes receiving a patterned photoresist formed over a substrate, the patterned photoresist defining initial openings, each of the initial openings including a first side and an opposite second side along a first direction; depositing a mask material preferentially on the first side within the initial openings using an oblique deposition process performed at a first angle inclined from the first side; and removing a portion of the patterned photoresist using an oblique etch process performed at a second angle inclined from the second side, the mask material and a remaining portion of the patterned photoresist defining final openings.

In accordance with an embodiment of the present invention, a method of processing a substrate that includes: forming initial recesses in a layer of an organic material deposited over a substrate, each of the initial recesses having a rectangular shape with four sides; depositing a mask material within the initial recesses on a first side of the four sides using a first oblique deposition process; depositing the mask material within the initial recesses on a second side of the four sides using a second oblique deposition process, the second side being opposite of the first side; depositing the mask material within the initial recesses on a third side of the four sides using a third oblique deposition process, where the first, the second, and the third oblique deposition processes are performed at angles of incident inclined from the first, the second, and the third side, respectively; and forming final recesses by removing a portion of the organic material using an oblique etch process, the oblique etch process being controlled to direct etchants to a fourth side of the four sides, being selective to the mask material, and being performed at an angle of incident inclined from the fourth side, the mask material remaining over the substrate and separating the final recesses.

In accordance with an embodiment of the present invention, a method of processing a substrate that includes: patterning a photoresist deposited over a substrate using a lithographic process, the patterned photoresist defining initial openings, the initial openings having a first side and an opposite second side along a first direction; loading the substrate in a processing chamber; within the processing chamber, performing a first oblique gas cluster ion beam (GCIB) process to preferentially deposit a mask material within the initial openings on the first side; and within the processing chamber, performing a second oblique gas cluster ion beam (GCIB) process to form final openings by preferentially removing a portion of the photoresist, the portion of the photoresist being between the first side and the second side of the initial openings adjacent to each other in a second direction, the mask material remaining over the substrate and separating the final openings along the second direction.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A-2E illustrate cross-sectional and top views of an example substrate during a fabrication process comprising tip-to-tip critical dimension control at various stages in accordance with various embodiments, wherein FIG. 2A illustrates the incoming substrate comprising slotted openings defined by a pattern of a photoresist, FIG. 2B illustrates the substrate after an oblique deposition step, FIG. 2C illustrates the substrate after a lateral directional etch step, FIG. 2D illustrates the substrate after a first pattern transfer etch and FIG. 2E illustrates the substrate after a second pattern transfer etch;

FIGS. 3A and 3B illustrate cross-sectional views of an example substrate during tip-to-tip critical dimension control in accordance with various embodiments, wherein FIG. 3A illustrates the substrate after an oblique deposition step, and FIG. 3B illustrates the substrate after an etch bask step;

FIGS. 4A and 4B illustrate cross-sectional and top views of an example substrate during a fabrication process comprising tip-to-tip critical dimension control at various stages in accordance with alternate embodiments, wherein FIG. 4A illustrates the substrate after oblique deposition steps for three directions, and FIG. 4B illustrates the substrate after a lateral directional etch step;

FIGS. 5A-5D illustrate cross-sectional and top views of an example substrate during a fabrication process comprising tip-to-tip critical dimension control and scum removal at various stages in accordance with other embodiments, wherein FIG. 5A illustrates the incoming substrate comprising slotted openings defined by a pattern of a photoresist and a scum of the photoresist in one of the slotted openings, FIG. 5B illustrates the substrate after first oblique deposition steps for two directions, FIG. 5C illustrates the substrate after a scum trimming step, and FIG. 5D illustrates the substrate after another oblique deposition step; and FIGS. 6A-6C illustrate example process flow diagrams of the fabrication process comprising tip-to-tip critical dimension control, wherein FIG. 6A illustrates an embodiment, FIG. 6B illustrates an alternate embodiment, and FIG. 6C illustrates yet another embodiment.

DETAILED DESCRIPTION OF ILLUSTRATIVE EMBODIMENTS

This application relates to a method of processing a substrate, more particularly to controlling a distance between adjacent ends of two recesses/openings, referred to as tip-to-tip (T2T) critical dimension (CD). One challenge with patterning semiconductor substrates is precisely controlling CDs of features fabricated on a substrate. The CD control is particularly challenging in sub-resolution dimensions and relatively small dimensions (e.g., less than 100 nm) such as those patterned with extreme ultraviolet radiation lithography (EUVL). Processes that requires a precise CD control include T2T CD control with EUVL single exposure. Further scaling of middle-of-line (MOL) contacts and back-end-of-line (BEOL) interconnects requires reducing T2T CD. However, as the feature size becomes smaller, it becomes increasingly challenging. For example, stochastic effects due to random behavior of photons generally causes unpredictable defects and roughness in patterns, which increases T2T CD variation on a wafer. Because the photon energy is high in EUV, T2T CD variation after EUVL single exposure may be too large and possibly lead to fatal device failures. Some available techniques, such as self-aligned block techniques, can reduce T2T CD variation, but only at the expense of patterning cost and time. Therefore, simpler, cost-effective T2T CD control processes may be desired. Embodiments of the present application disclose methods of T2T CD control based on oblique deposition of a etch mask material. Various embodiments may utilize an oblique physical vapor deposition (PVD) tool, a gas cluster ion beam (GCIB) tool, or similar tools. Techniques can also include directional trim of photoresist relief patterns.

The methods described in this disclosure may advantageously reduce T2T CD variation by replacing the relief pattern of photoresist with deposits formed on the sidewalls of the relief patterns. Oblique deposition can allow precise thickness control for the deposits to be formed, thereby reducing the initial CD variations of the relief pattern. Various embodiments of the methods herein may advantageously improve various patterning processes including those based on EUVL single exposure by reducing the dose requirement.

In the following, an example of tip-to-tip (T2T) critical dimension (CD) of slotted openings is first introduced in FIG. 1. Next, steps of T2T CD control using oblique deposition are described referring to FIGS. 2A-2E in accordance with various embodiments. An optional etch back step for the formed deposits is then described referring to FIGS. 3A-3B. Embodiments of oblique deposition for more than one direction are described referring to FIGS. 4A-4B and 5A-5D. Example process flow diagrams are illustrated in FIG. 6A-6C. All figures in this disclosure are drawn for illustration purpose only and not to scale, including the aspect ratios of features.

Figure 1:
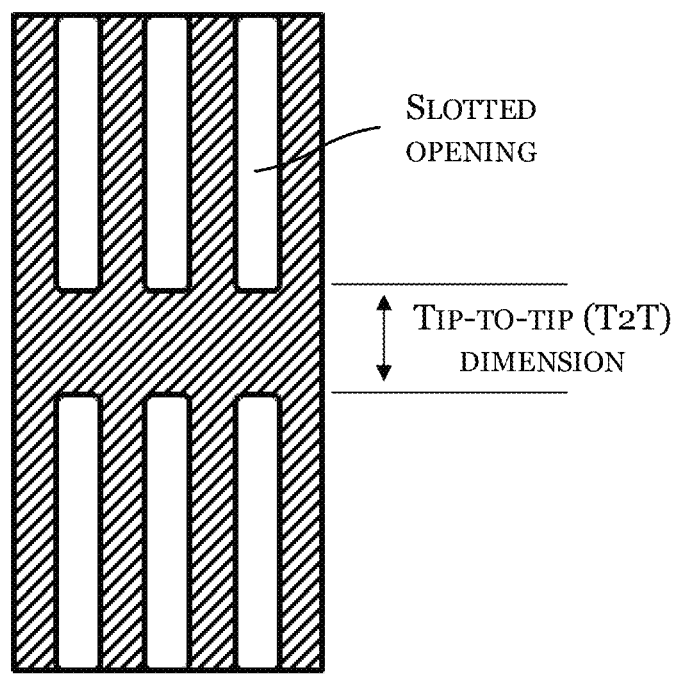
FIG. 1 illustrates a top view of a substrate segment having generic trenches or slotted openings.

FIG. 1 illustrates a top view of a substrate segment having generic trenches or slotted openings.

In FIG. 1, six slotted openings are illustrated for example. In this disclosure, tip-to-tip (T2T) critical dimension (CD) refers to a distance between the adjacent ends of two slotted openings as indicated in FIG. 1. Precisely controlling the T2T CD with minimal variation among the slotted openings is imperative to prevent fatal device failures. However, the stochastic effects, particularly in EUV lithography, often worsen the T2T CD variation when the number of photons irradiated per area is small. This issue of T2T CD variation may be mitigated by increasing the dose of a lithographic exposure (thus the number of photons per area), but having a lower dose of radiation is generally preferred for many fabrication techniques in terms of throughput and process efficiency.

Figure 2E:
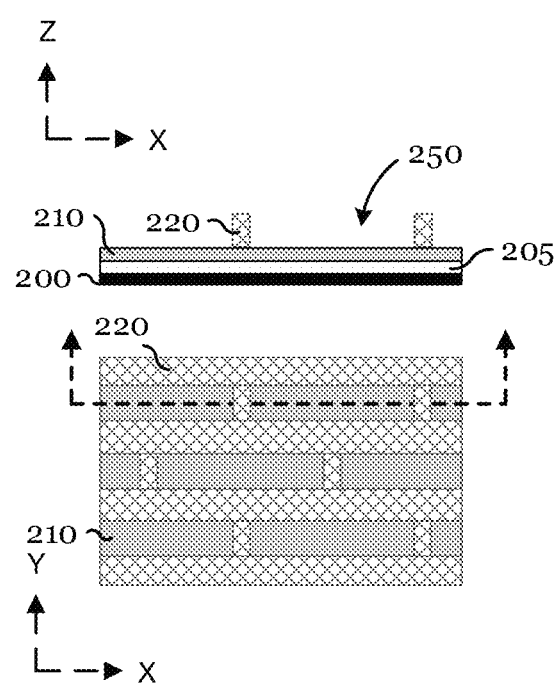

FIGS. 2A-2E illustrate cross-sectional and top views of an example substrate 200 during a fabrication process comprising T2T CD control at various stages in accordance with various embodiments, wherein FIG. 2A illustrates the incoming substrate 200 comprising slotted openings 250 defined by a pattern of a photoresist 240.

In various embodiments, the substrate 200 may be a part of, or include, a semiconductor device, and may have undergone a number of steps of processing following, for example, a conventional process. The substrate 200 accordingly may comprise layers of semiconductors useful in various microelectronics. For example, the semiconductor structure may comprise the substrate 100 in which various device regions are formed.

In one or more embodiments, the substrate 200 may be a silicon wafer, or a silicon-on-insulator (SOI) wafer. In certain embodiments, the substrate 200 may comprise a silicon germanium, silicon carbide, gallium arsenide, gallium nitride, and other compound semiconductors. In other embodiments, the substrate 200 comprises heterogeneous layers such as silicon germanium on silicon, gallium nitride on silicon, silicon carbon on silicon, as well layers of silicon on a silicon or SOI substrate. In various embodiments, the substrate 200 is patterned or embedded in other components of the semiconductor device.

As illustrated in FIG. 2A, the substrate 200 may further comprise an underlying layer 205. In various embodiments, the underlying layer 205 may be the layer to be patterned to fabricate recess features for middle-of-line (MOL) contacts or back-end-of-line (BEOL) interconnects. In various embodiments, the underlying layer 205 may be a dielectric layer comprising a silicon-based dielectric material with a low dielectric constant (i.e., low-k value) such as organosilicate glass (SiCOH), dense SiCOH, porous SiCOH, and other porous dielectric materials. The underlying layer 205 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), and sputtering. In certain embodiments, wet deposition techniques such as spin-on process may be used. The feature being etched into the underlying layer 205 may be any suitable feature. For example, although this disclosure primarily describes "recesses" or "slotted openings" with respect to the figures of this disclosure, it will be appreciated that other suitable features might be formed in a semiconductor layer, including (whether or not considered "recesses") lines, holes, trenches, vias, and/or other suitable structures, using embodiments of this disclosure.

Over the underlying layer 205, a layer of a hard mask 210 may be formed. In various embodiments, the hard mask 210 may comprise titanium nitride, titanium, titanium oxide, tantalum, tungsten carbide, other tungsten based compounds, ruthenium based compounds, or aluminum based compounds. The hard mask 210 may be deposited using suitable deposition techniques such as vapor deposition including chemical vapor deposition (CVD), physical vapor deposition (PVD), as well as other plasma processes such as plasma enhanced CVD (PECVD), sputtering, and other processes. The hard mask 210 may have a thickness of about 5 nm to about 50 nm in various embodiments.

Further illustrated in FIG. 2A, a tri-layer stack may be formed over the hard mask 210. The tri-layer stack may be used to generate and transfer a pattern to the hard mask 210 and then the underlying layer 205. In various embodiments, the tri-layer stack may comprise a bottom layer 220, a middle layer 230, and a photoresist 240. The bottom layer 220 may comprise carbon materials and may be formed via a spin-on process or vapor deposition such as CVD. The middle layer 230 may comprise silicon-based materials, including but not limited to spin-on glass (SOG), silicon carbide, silicon oxide, silicon oxycarbide, silicon oxynitride, silicon nitride, tin oxide, and bottom anti-reflective coating films (BARC). The middle layer 230 may also be formed by a spin-on process or vapor deposition such as CVD.

The photoresist 240 of the tri-layer stack may be formed and patterned to define slotted openings 250 that provides an initial pattern to form recess features in the layers below the patterned layer of the photoresist 240. In various embodiments, the photoresist 240 may be an extreme ultraviolet (EUV) resist and patterned by a EUV lithographic process. In other embodiments, the photoresist 240 may comprise 248 nm resists, 193 nm resists, 157 nm resists, or electron beam (EB) sensitive resists. The photoresist may be a chemically amplified resist (CAR), a metal oxide resist (MOR), or others. In various embodiments, the photoresist 240 may be deposited over the middle layer 230 using a dry process or wet process, for example, a spin-coating technique. The deposited photoresist 240 may be then patterned with an appropriate lithographic process. In one embodiment, the photoresist 240 has a thickness between 5 nm and 100 nm. Features to be patterned using the patterned photoresist 240 may have a desired critical dimension (CD), or width, for layers to be patterned.

In various embodiments, one or more of the slotted openings 250 has a rectangular shape with a length in a horizontal direction (e.g., x-direction) and a width in a second direction perpendicular to the horizontal direction (e.g., y-direction). Example x-y coordinates are illustrated in the top view of FIG. 2A, and used to refer directions in the following. Similarly, example x-z coordinates are illustrated in the cross-sectional view of FIG. 2A. The slotted openings 250 are initially provided by the pattern of the photoresist 240, and in certain embodiments, the pattern may have pitches enabled by EUV lithography. In one or more embodiments, the pitch in the y-direction $p_y$ may be between 10 nm and 100 nm. In various embodiments, the length of each of the slotted openings 250 may be equal to, or greater than, the width of each of the slotted openings 250. Although all of the slotted openings 250 are illustrated to have the same dimensions (i.e., the length and the width) in FIG. 2A, the shape and size for the slotted openings 250 may be varied depending on the desired design for interconnects to be fabricated. FIG. 2A further indicates the tip-to-tip (T2T) critical dimension (CD) as the distance between the right end of one of the slotted openings 250 and the left end of another of the slotted openings 250 adjacent to the right in the x-direction. Accordingly, the slotted openings 250 aligned in the x-direction are separated by portions of the photoresist 240 having a width of T2T CD. In one or more embodiments, the T2T CD may be between 1 nm and 100 nm. In various embodiments, as illustrated in the top view of FIG. 2A, the slotted openings 250 may be arranged so that they form first lines of patterned photoresist 241 in the x-direction, where the first lines of patterned photoresist 241 are separated by second lines of photoresist 242. The cross-sectional view of FIG. 2A illustrates a view corresponding to the cross-section at one of the first lines of patterned photoresist 241.

In one embodiment, the length (i.e., x-dimension) of each of the slotted openings 250 may be about 40 nm, and 3σ (three standard deviations) of the initial T2T CD may be 5 nm or greater. Such a level of variance in the T2T CD may be caused by a low-dose single EUVL exposure process, and may not be acceptable for a subsequent process due to a large edge placement error (EPE). Various embodiments of the methods of this disclosure utilizes oblique deposition to deposit an etch mask material that replaces the patterned photoresist 240 and redefine the recess patterns, which may advantageously reduce the T2T CD variation.

FIG. 2B illustrates the cross-sectional and top views of the substrate 200 after an oblique deposition step.

In FIG. 2B, an etch mask material 260 may be deposited by the oblique deposition step over only one sidewall of each of the slotted openings 250 in accordance with some embodiments. In the illustrated example, the oblique deposition step is performed from a left side indicated by dotted arrows in FIG. 2B (along the x-axis), consequently forming a layer of the etch mask material 260 on the right end of each of the slotted openings 250 (i.e., over the right sidewalls of the patterned photoresist 240). In other embodiments, as further described in later sections (e.g., FIGS. 4A-4B and 5A-5B), the oblique deposition step may comprise one or more deposition from more than one direction and/or etch back processes to deposit the etch mask material 260 over two or three ends of each of the slotted openings 250.

The oblique deposition may be realized using a directional physical vapor deposition (PVD) tool or gas cluster ion beam (GCIB) tool. In various embodiments, the etch mask material 260 may be deposited by the oblique deposition at angles of incidence of 10 to 80 degrees with respect to a horizontal surface of the underlying layers (e.g., the underlying layer 205). The angle of incidence for the oblique deposition may be determined according to the aspect ratio of features (e.g., the ratio of the height to the width of the slotted openings 250). In general, a higher angle of incidence may be selected for a feature with a higher aspect ratio. In one embodiment, for example, where the slotted openings 250 has an aspect ratio of 1:1 (height:width), the optical angle of incident may be 45 degrees or higher to enable proper deposition on the sidewall. In other embodiments, the width of the slotted openings 250 may be greater than the height, and the angle of incidence lower than 45 degrees may be selected to minimize the deposition on the bottom of the slotted openings 250. The etch mask material 260 may be any suitable material that can be used as an etch mask during the subsequent etch steps such as pattern transfer etch processes. In various embodiments, the etch mask material 260 may comprise an organic material, oxide, nitride, carbon, silicon, SiO, SiN, SiON, Sn, SnO, Ti, TiO, TiN, Ta, TaN, Al, AlO, Zr, ZrO Hf, HfO, W, or WC. In certain embodiments, the etch mask material 260 may have a thickness of 0.1 nm and 5.0 nm. The use of vapor deposition techniques allows the precise thickness control, thereby enabling the uniform deposition among the slotted openings 250. In one or more embodiments, the 3σ (three standard deviations) of the thickness of the etch mask material 260 may be 3 nm or less, which may be substantially smaller than the variations of the T2T CD between the slotted openings 250.

In certain embodiments, one or more GCIB processes may advantageously be used for oblique deposition. For example, a first GCIB may be formed from a first process gas comprising a precursor for the etch mask material 260 in a processing chamber, and the substrate 200 may be exposed to the first GCIB with a first angle of incidence between 10 and 80 degrees such that the first GCIB impinges on the right sidewalls of the patterned photoresist 240.

FIG. 2C illustrates the cross-sectional and top views of the substrate 200 after a lateral directional etch step.

In FIG. 2C, the lateral directional etch step removes a portion of the patterned photoresist 240. The lateral directional etch step may be performed using a gas cluster ion beam (GCIB) process or an anisotropic plasma etch such as reactive ion etching (RIE) process. The process conditions may be selected such that etching of the photoresist 240 is selective to the etch mask material 260. In the illustrated example, the lateral directional etch step is performed from a right side indicated by dotted arrows in FIG. 2C (i.e., along the x-axis but from the opposite side of the oblique deposition). In various embodiments, the lateral directional etch step may be performed at angles of incidence of 10 to 80 degrees with respect to the horizontal surface of the underlying layers (e.g., the underlying layer 205). During the lateral directional etch step, the removal of the patterned photoresist 240 may occur only from one side of the slotted openings 250 (e.g., from the right side in FIG. 2C). Further, etching in the vertical direction may be minimized also due to the angle of the lateral directional etch. As a result, each of the slotted openings 250 may be extended towards the side that is not covered by the etch mask material 260 (e.g., to the left side in FIG. 2C). In various embodiments, the entire portion of the first lines of patterned photoresist 241 (i.e., the photoresist 240 adjacent to the etch mask material 260 in the x-direction) may be removed, and the second lines of photoresist 242 may remain. The extended slotted openings 250 may be therefore separated only by the etch mask materials 260 in the x-direction, and by the remaining photoresist 240 in the y-direction. In other embodiments, a portion of the photoresist 240 may be remaining on etch mask material 260 in the x-direction. After the steps of oblique deposition and lateral directional etch, the initial pattern provided by the photoresist 240 is updated to a final pattern comprising the remaining portion of the photoresist 240 and the deposited etch mask material 260. The final tip-to-tip (T2T) critical dimension (CD) of the final pattern may have a variation smaller than the variation of T2T CD of the initial pattern. In various embodiments, the final pattern may be used to further pattern the underlying layers (e.g., the middle layer 230 and the bottom layer 220) in subsequent processes.

In certain embodiments, similar to the oblique deposition, one or more GCIB processes may advantageously be used for the lateral directional etch. For example, a second GCIB may be formed from a second process gas comprising an etchant in a processing chamber, and the substrate 200 may be exposed to the second GCIB with a second angle of incidence between 10 and 80 degrees such that the first GCIB impinges on the left sidewalls of the patterned photoresist 240 to be etch. Utilizing two different GCIB processes in the same processing chamber for the oblique deposition and the lateral directional etch may advantageously improve the process efficiency. In one or more embodiments, the methods may include switching from the first GCIB process to the second GCIB process by replacing the first process gas with the second process gas and switching from the first angle to the second angle.

FIG. 2D illustrates the cross-sectional and top views of the substrate 200 after a first pattern transfer etch, and FIG. 2E illustrates the cross-sectional and top views of the substrate 200 after a second pattern transfer etch.

One or more anisotropic etch processes may be performed to pattern the layers of the tri-layer stack (i.e., the middle layer 230 and the bottom layer 220) according to the final pattern provided from the process above comprising oblique deposition. In FIG. 2D, the final pattern of the slotted openings 250 are transferred to the middle layer 230 by the first transfer etch, and further to the bottom layer 220 by the second transfer etch as illustrated in FIG. 2E. In various embodiments, one or more of the pattern transfer etch processes may be timed or stopped at an underlying (optional) etch stop layer. In certain embodiments, the patterning of the middle layer 230 and the bottom layer 220 may be achieved in a continuous, single etch process. Once the layers of the tri-layer stack is patterned, another pattern transfer may be performed to further transfer the pattern to the hard mask 210. After patterning the hard mask 210, remaining portions of the photoresist 240, the middle layer 230, the bottom layer 220, and/or the etch mask material 260 may be removed. Finally, the patterned hard mask 210 may be used as an etch mask to pattern the underlying layer 205. In various embodiments, one or more of the anisotropic etch processes may comprise plasma etch processes such as reactive ion etch (RIE) processes, or combinations of etch processes. After the second pattern transfer etch, the hard mask 210 may be exposed, and subsequent processes to fabricate a semiconductor device may be performed. In some embodiments, the patterns may be useful to fabricate middle-of-line (MOL) contacts or back-end-of-line (BEOL) interconnects. Accordingly, the subsequent processes may comprise diffusion barrier layer deposition, metallization, and planarization. In one or more embodiments, the diffusion barrier layer deposition may be performed using deposition processes such as sputtering, vapor deposition including chemical vapor deposition (CVD), physical vapor deposition (PVD), and atomic layer deposition (ALD), as well as other plasma processes such as plasma enhanced CVD (PECVD), the metallization may be performed by a seed layer deposition of a metal (e.g., copper) using a sputtering or physical vapor deposition (PVD) technique followed by electroplating, and the planarization may be performed using a chemical mechanical planarization (CMP) method.

Figures 3A, 3B:
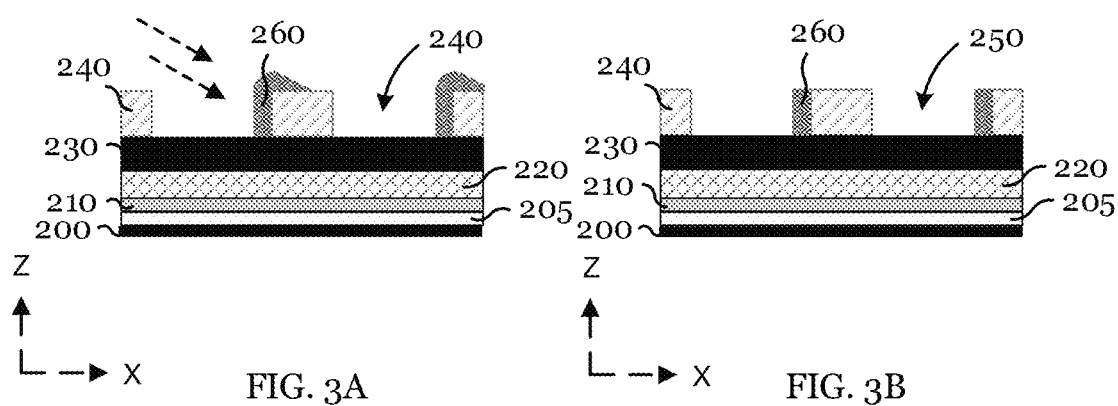

FIGS. 3A and 3B illustrate cross-sectional views of an example substrate 200 during tip-to-tip critical dimension control in accordance with alternate embodiments. FIG. 3A illustrates the cross-sectional view of the substrate 200 after an oblique deposition step that causes some deposition on top surfaces of the patterned photoresist 240. FIG. 3B illustrates the cross-sectional view of the substrate 200 after an optional etch bask step. The substrate 200 may have a layer structure substantially same as prior embodiments described above, and thus the details will not be repeated.

In certain embodiments, after the oblique deposition (e.g., FIG. 2B) and prior to the lateral directional etch for the photoresist 240 (e.g., FIG. 2C), the optional etch back may be performed to trim a portion of the deposited etch mask material 260. The deposition of the etch mask material 260 during the oblique deposition step may occur on the top surfaces of the patterned photoresist 240 as illustrated in FIG. 3A. Since such top deposits of the etch mask material 260 may hamper the following lateral directional etch for the photoresist 240, it may be desirable to remove the top deposits of the etch mask material 260 prior to the lateral directional etch. This optional etch back may be performed using one or more anisotropic etch processes, for example, plasma etch processes such as reactive ion etch (RIE) processes. In one or more embodiments, gas cluster ion beam (GCIB) processes may be used. In various embodiments, depending on the critical dimension (CD) of the target pattern for the middle layer 230, this optional etch back may be skipped since both the remaining etch mask material 260 and the photoresist 240 may collectively function as an etch mask to pattern the middle layer 230. Instead of performing the optional etch back, the etching conditions during patterning the middle layer 230 may be adjusted accordingly.

Figure 4A:
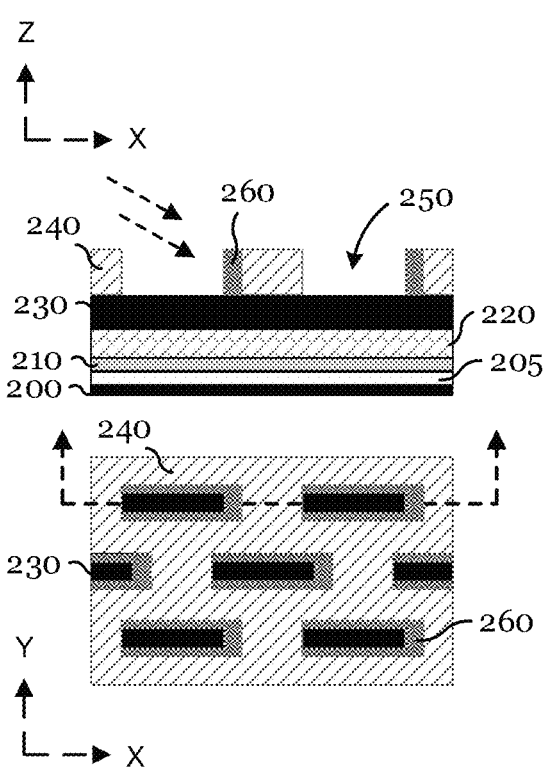
Figure 4B:
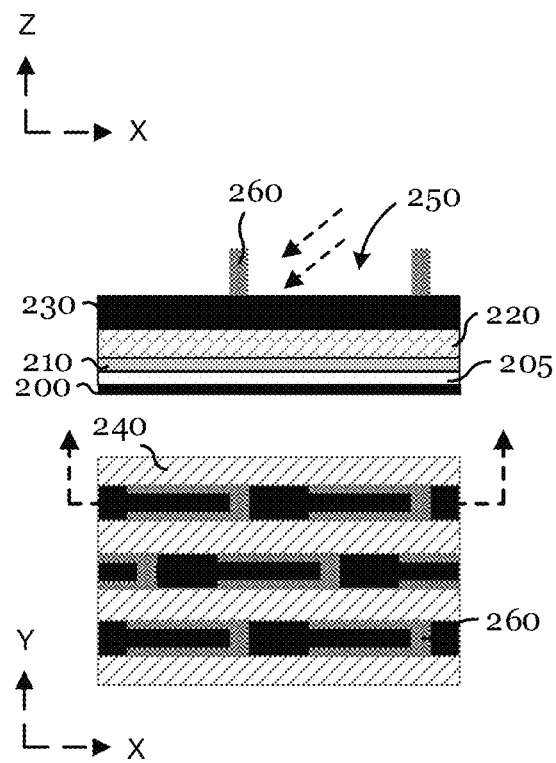

FIGS. 4A and 4B illustrate cross-sectional and top views of an example substrate 200 during a fabrication process comprising tip-to-tip critical dimension control at various stages in accordance with alternate embodiments. FIG. 4A illustrates the cross-sectional and top views of the substrate 200 after oblique deposition steps performed for three directions. FIG. 4B illustrates the cross-sectional and top views of the substrate 200 after a lateral directional etch step. The substrate 200 may have a layer structure substantially same as prior embodiments described above, and thus the details will not be repeated.

While prior embodiments describe the oblique deposition to form the deposit of the etch mask material 260 only on one end of the slotted openings 250 (e.g., FIG. 2B), in other embodiments, the etch mask material 260 may be deposited on two or three ends of the slotted openings 250. To enable this, one or more oblique deposition steps may be performed. In the illustrated example of FIG. 4A, three ends of the slotted openings 250 are coated with the etch mask material 260; they are the top and bottom ends (i.e., two sidewalls of the photoresist 240 along the x-direction) and the right end (i.e., one sidewall of the photoresist 240 along the y-direction). The etch mask material 260 deposited on the top and bottom ends may advantageously improve the directionality of the following lateral directional etch step to etch a portion of the photoresist 240, by preventing the slotted openings 250 from widening in the y-direction (FIG. 4B). After the lateral direction etch step, subsequent processes may follow the steps described in prior embodiments (e.g., FIGS. 2D-2E). In various embodiments, a variety of processing sequence of multiple oblique deposition and subsequent etch steps may be applied.

Figures 5A, 5B:
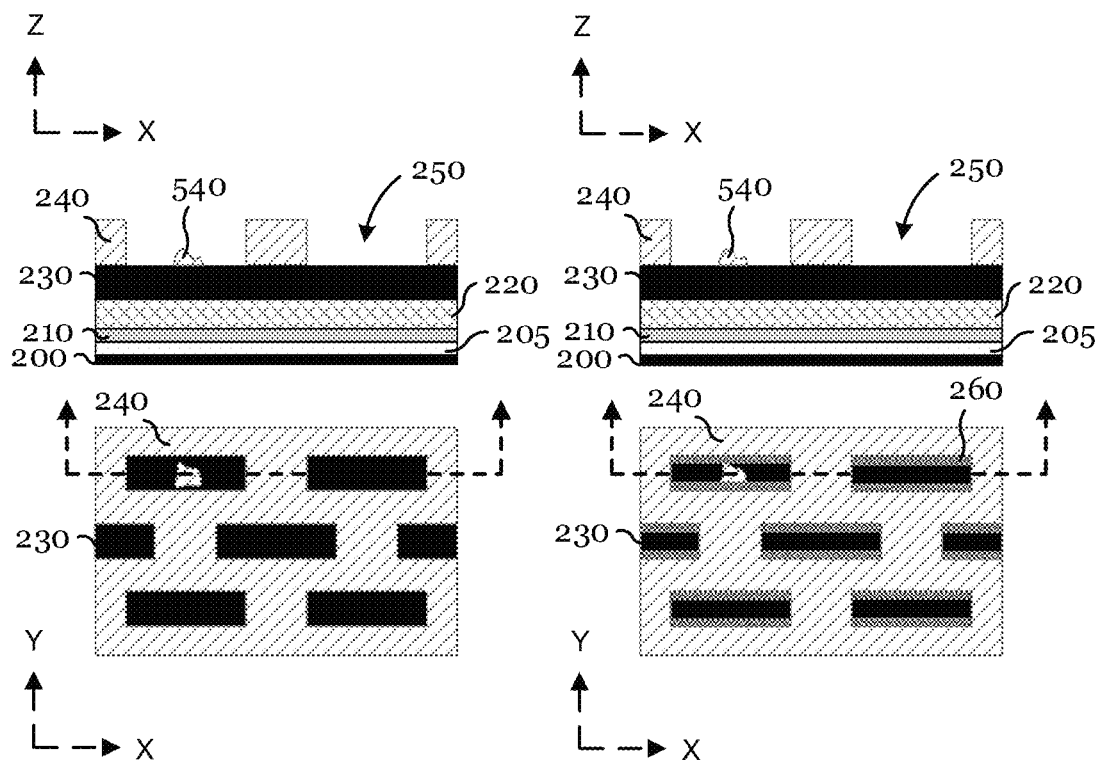

FIGS. 5A-5D illustrate cross-sectional and top views of an example substrate 200 during a fabrication process comprising tip-to-tip (T2T) critical dimension (CD) control and scum removal at various stages in accordance with other embodiments. FIG. 5A illustrates the cross-sectional and top views of the incoming substrate 200. The substrate 200 may have a layer structure substantially same as prior embodiments described above, and thus the details will not be repeated.

In FIG. 5A, the substrate 200 may further comprise a scum of photoresist 540, which is an unwanted residue remaining within one of the slotted openings 250 after a previous step. The scum of photoresist 540 may be formed, for example, due to incomplete development of photoresist. The methods of oblique deposition and etch may be utilized to clean up the scum of photoresist 540 during a process for T2T CD control. It should be noted that a scum of material other than the photoresist 240 may also be removed based on the method.

FIG. 5B illustrates the cross-sectional and top views of the substrate 200 after oblique deposition steps for two directions.

In FIG. 5B, a first oblique deposition of the etch mask material 260 may be performed for the top and bottom ends of the slotted openings 250. Unlike prior embodiments, at this stage, neither of the left or right end of the slotted openings 250 is covered with the etch mask material 260, which may be beneficial to minimize the deposition of the etch mask material 260 on the scum of photoresist 540. Since the length of the slotted openings 250 may be greater than the width (i.e., the dimension is greater in the x-direction), the shadowing effect during the oblique deposition may be greater in the y-direction than in the x-direction. Accordingly, the oblique deposition for two ends in the x-direction may be performed first at this stage, while another oblique deposition step for a third end of the slotted openings 250 may be performed later (e.g., FIG. 5D), for example, after a scum trimming step (FIG. 5C).

Figures 5C, 5D:
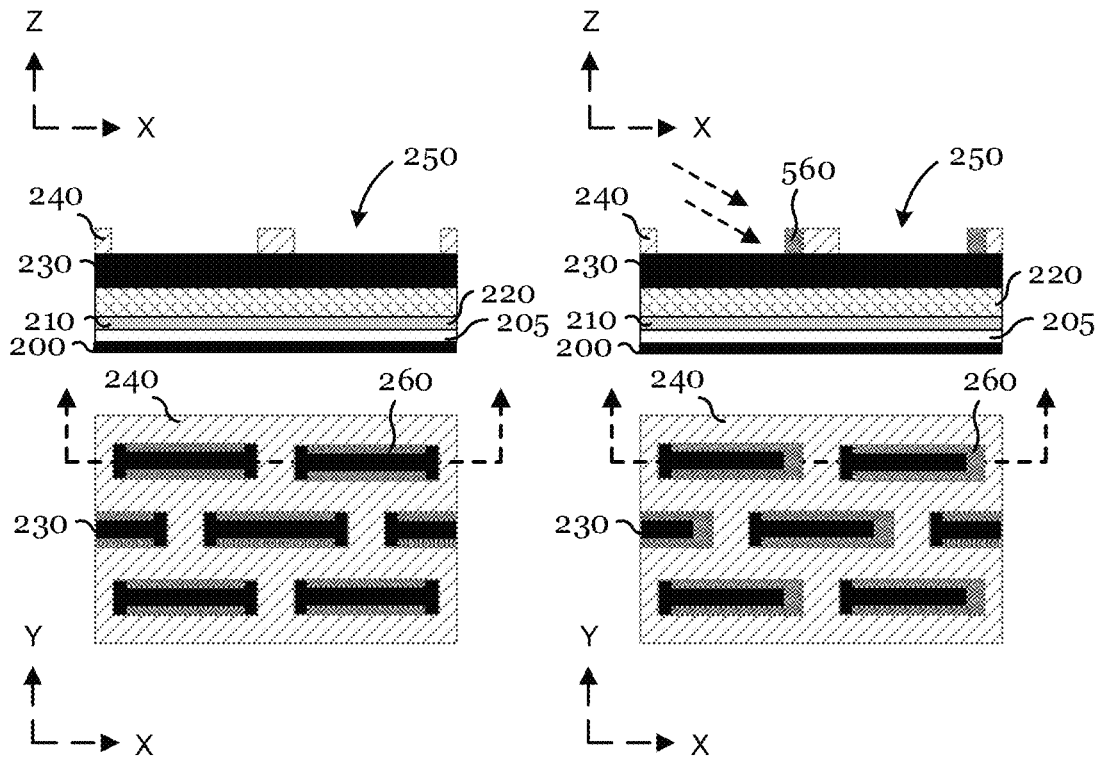
Figure 6A:
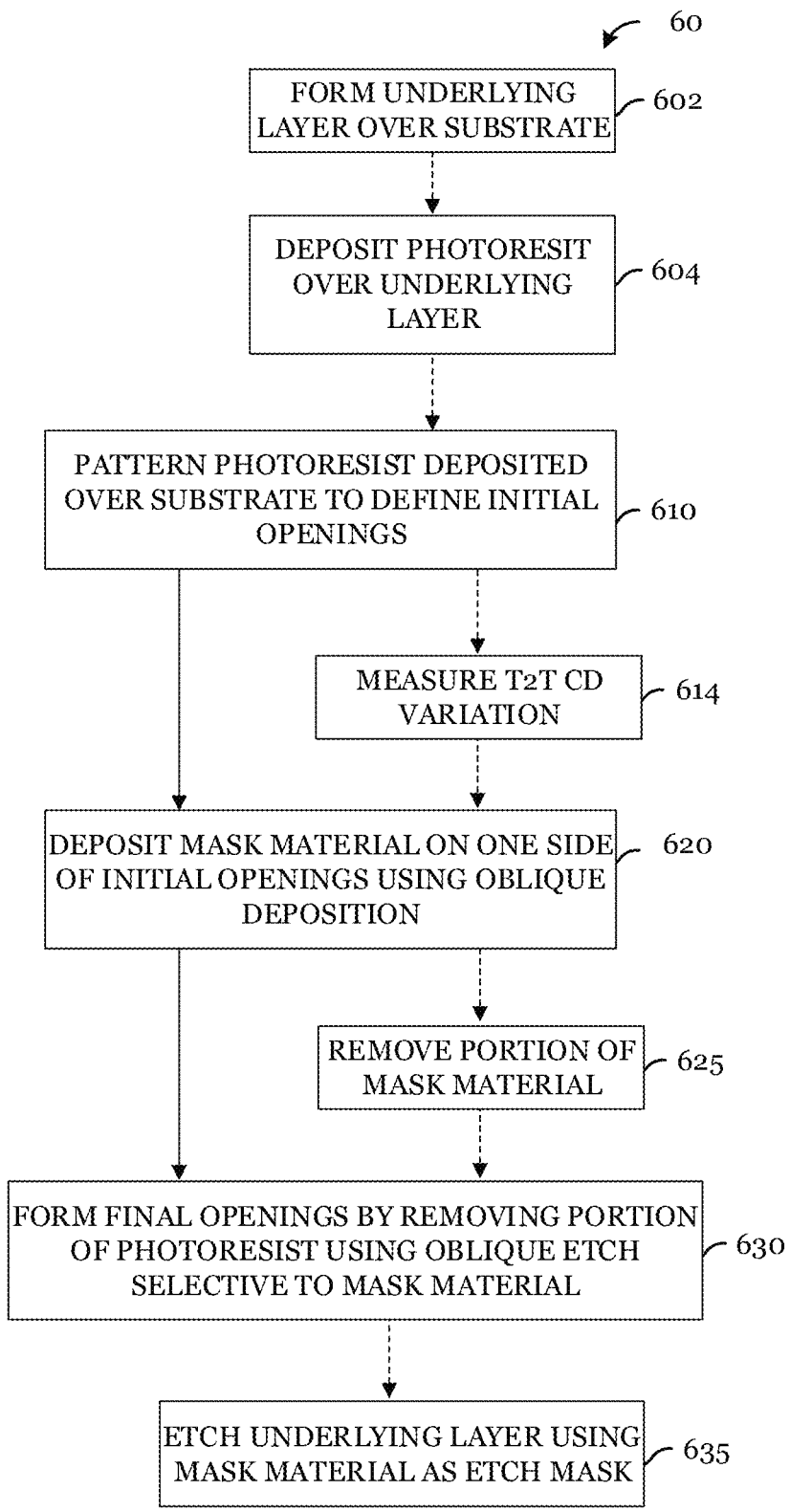
Figure 6B:
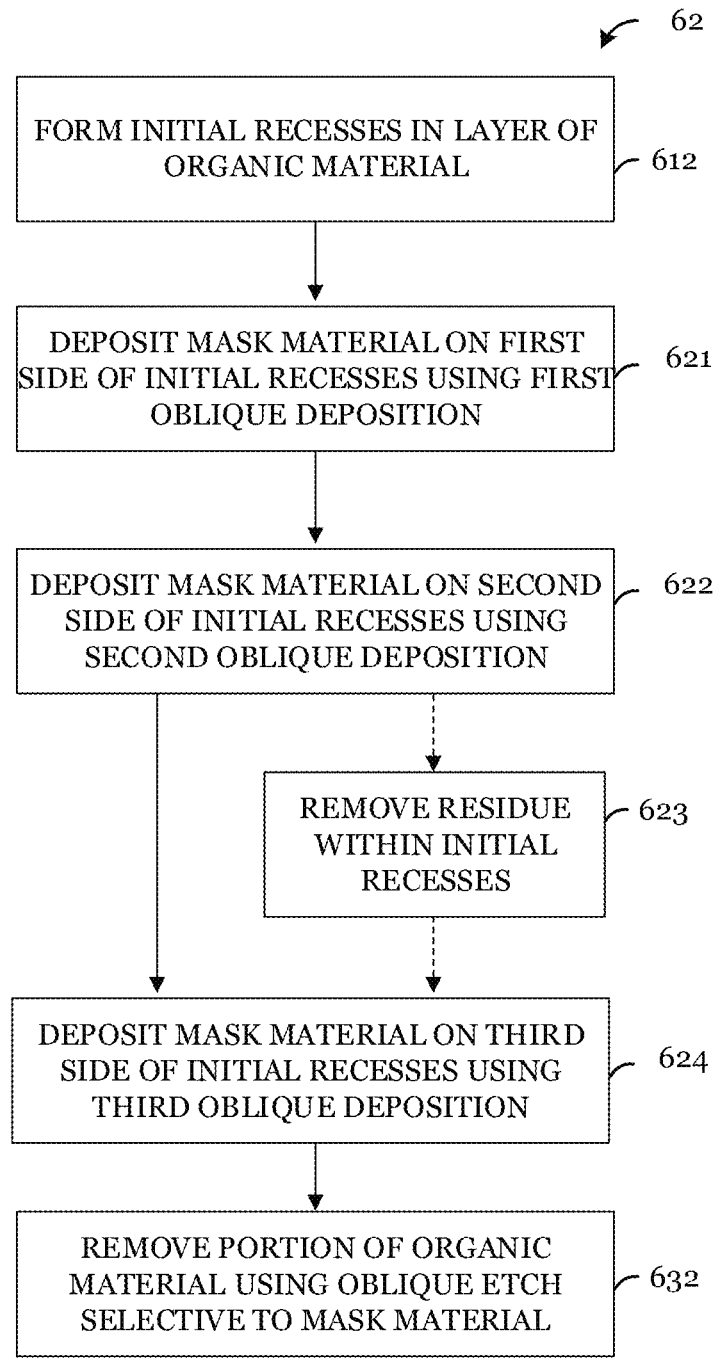
Figure 6C:
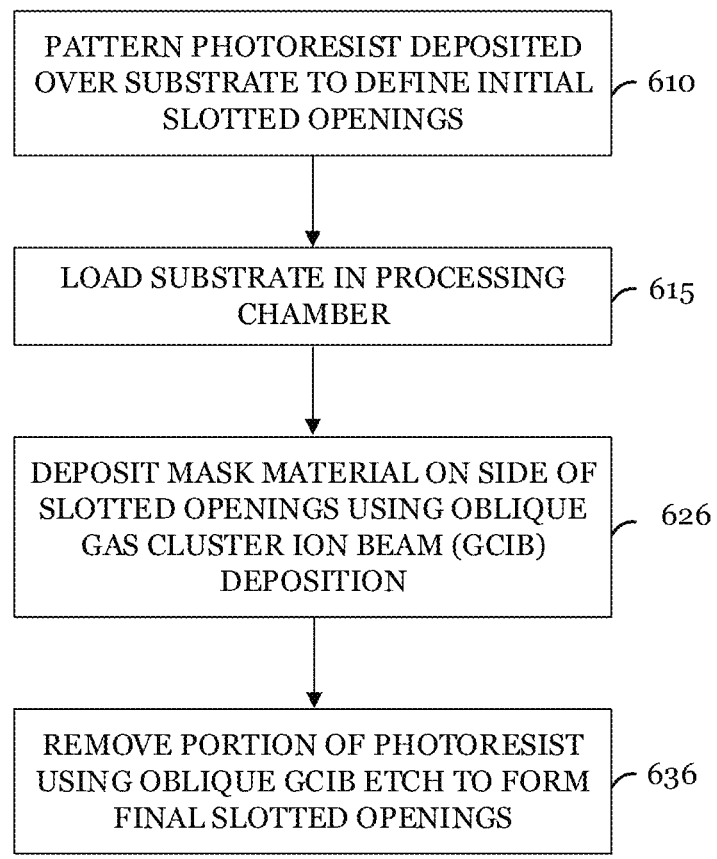

FIG. 5C illustrates the cross-sectional and top views of the substrate 200 after a scum trimming step.

The scum trimming step may be performed using one or more etch processes, for example, plasma etch processes such as reactive ion etch (RIE) processes. In various embodiments, during the scum trimmings step, a portion of the patterned photoresist 240 may also be removed in addition to the scum of photoresist 540, resulting in the slotted openings 250 extended in the x-direction. This extension in the x-direction corresponds to the reduction of tip-to-tip (T2T) critical dimension (CD). Accordingly, the scum trimmings step may need to be precisely timed to avoid punching through the wall due to excessive removal of the photoresist. On the other hand, the etch mask material 260 deposited on the top and bottom end of the slotted openings 250 can be a protective layer to prevent the slotted openings 250 from widening in the y-direction.

FIG. 5D illustrates the cross-sectional and top views of the substrate 200 after another oblique deposition step.

After the scum trimming step, another oblique deposition step may be performed to deposit the etch mask material 260 on a third end of the slotted openings 250 (e.g., the right end of the slotted openings 250). Subsequently, similar to prior embodiments, a lateral directional etch step (e.g., FIG. 2C), pattern transfer etch steps (e.g., FIGS. 2D-2E), and other processes may follow.

FIGS. 6A-6C illustrate example process flow diagrams of the fabrication process comprising tip-to-tip critical dimension control, wherein FIG. 6A illustrates an embodiment, FIG. 6B illustrates an alternate embodiment, and FIG. 6C illustrates yet another embodiment. The process flow can be followed with the figures (FIGS. 2A-2E, 4A-4B, and 5A-5D) discussed above and hence will not be described again.

In FIG. 6A, a process flow 60 starts with patterning a photoresist deposited over a substrate using a lithographic process to define initial openings (block 61o, FIG. 2A). In certain embodiments, prior to patterning the photoresist, the process flow 60 may include forming an underlying layer over the substrate (block 602), followed by depositing the photoresist over the underlying layer (block 604). After patterning the photoresist, a mask material may be deposited within the initial openings on a side using an oblique deposition process (block 620, FIG. 2B). In one embodiment, prior to the oblique deposition process (block 620), the T2T CD variation may optionally be measured for the initial openings on the substrate (block 614), and the process recipe for the oblique deposition, the oblique etch process, or both may be determined accordingly. In certain embodiments, after the oblique deposition, an optional etch back may be performed to trim the mask material if the mask material covers a portion of top surfaces of the photoresist (block 625, FIG. 3A). The process may then proceed to forming final openings by removing a portion of the photoresist using an oblique etch process (block 630, FIG. 2C). Subsequently, the final openings may be vertically extended into the underlying layer by etching the underlying layer using the mask material as an etch mask (block 635, FIGS. 2D-2E).

In FIG. 6B, a process flow 62 starts with forming initial recesses in a layer of an organic material deposited over a substrate (block 612, FIG. 2A). Next, a series of oblique deposition may be performed for three directions (FIG. 4A) as follows: a first oblique deposition process to deposit a mask material within the initial recesses on a first side (block 621); a second oblique deposition process to deposit the mask material within the initial recesses on a second side (block 622); and a third oblique deposition process to deposit the mask material within the initial recesses on a third side (block 624). In certain embodiments, between the second and the third oblique deposition processes, an optional etch may be performed to remove a residue, for example, comprising the organic material within the initial recesses (block 623, FIG. 5C). After the series of oblique deposition, final recesses may be formed by removing a portion of the organic material (block 632, FIGS. 4B and 5D).

In FIG. 6C, a process flow 64 starts with patterning a photoresist deposited over a substrate using a lithographic process to define initial slotted openings (block 61o, FIG. 2A). Next, the substrate may be loaded in a processing chamber (block 615). Within the processing chamber, a first oblique gas cluster ion beam (GCIB) process may be performed to deposit a mask material within the initial slotted openings on a side (block 626, FIG. 2B). A second oblique GCIB process may then be performed in the processing chamber to form final slotted openings by removing a portion of the photoresist (block 636, FIG. 2C).

Example embodiments of the invention are summarized here. Other embodiments can also be understood from the entirety of the specification as well as the claims filed herein.

Example 1

A method of processing a substrate that includes receiving a patterned photoresist formed over a substrate, the patterned photoresist defining initial openings, each of the initial openings including a first side and an opposite second side along a first direction; depositing a mask material preferentially on the first side within the initial openings using an oblique deposition process performed at a first angle inclined from the first side; and removing a portion of the patterned photoresist using an oblique etch process performed at a second angle inclined from the second side, the mask material and a remaining portion of the patterned photoresist defining final openings.

Example 2

The method of example 1, where receiving the patterned photoresist formed over the substrate includes: forming an underlying layer over the substrate; depositing a photoresist over the underlying layer; and patterning the photoresist using a lithographic process.

Example 3

The method of one of examples 1 or 2, where the lithographic process includes an extreme UV (EUV) single exposure.

Example 4

The method of one of examples 1 to 3, where tip-to-tip critical dimensions (T2T CDs) of the final openings are less than an optical resolution of the EUV single exposure.

Example 5

The method of one of examples 1 to 4, further including vertically extending the final openings into the underlying layer by etching the underlying layer using the mask material as an etch mask.

Example 6

The method of one of examples 1 to 5, further including, before removing the portion of the patterned photoresist, performing an anisotropic etch process to remove a portion of the mask material that is not on the first side.

Example 7

The method of one of examples 1 to 6, where the oblique deposition process or the oblique etch process includes a gas cluster ion beam (GCIB) process.

Example 8

The method of one of examples 1 to 7, where tip-to-tip critical dimensions (T2T CDs) of all of the initial openings of the substrate has a first standard deviation, where T2T CDs of all of the final openings of the substrate has a second standard deviation, and where the first standard deviation is greater than the second standard deviation.

Example 9

The method of one of examples 1 to 8, where tip-to-tip critical dimensions (T2T CDs) of the final openings are between 0.1 nm and 5 nm, and where 3σ value of T2T CDs of the final slotted openings is less than 3 nm.

Example 10

The method of one of examples 1 to 9, where the photoresist includes an organic photoresist and the mask material includes a dielectric material.

Example 11

The method of one of examples 1 to 10, where the initial openings further includes a third side and an opposite forth side along a second direction perpendicular to the first direction, further including depositing the mask material within the initial openings on the third side or the fourth side using another oblique deposition process, the another oblique deposition process being performed at a third angle inclined from the third side or at a fourth angle inclined from the fourth side.

Example 12

A method of processing a substrate that includes: forming initial recesses in a layer of an organic material deposited over a substrate, each of the initial recesses having a rectangular shape with four sides; depositing a mask material within the initial recesses on a first side of the four sides using a first oblique deposition process; depositing the mask material within the initial recesses on a second side of the four sides using a second oblique deposition process, the second side being opposite of the first side; depositing the mask material within the initial recesses on a third side of the four sides using a third oblique deposition process, where the first, the second, and the third oblique deposition processes are performed at angles of incident inclined from the first, the second, and the third side, respectively; and forming final recesses by removing a portion of the organic material using an oblique etch process, the oblique etch process being controlled to direct etchants to a fourth side of the four sides, being selective to the mask material, and being performed at an angle of incident inclined from the fourth side, the mask material remaining over the substrate and separating the final recesses.

Example 13

The method of example 12, where the initial recesses include a residue of the organic material at a bottom of the initial recesses, and further including, after depositing the mask material within the initial recesses on the first side and the second side and before depositing the mask material within the initial recesses on the third side, removing the residue using an etch process.

Example 14

The method of one of examples 12 or 13, the etch process includes a plasma etch process selective to the mask material, where the mask material provides protections of the first side and the second side during the etch process.

Example 15

The method of one of examples 12 to 14, where the first oblique deposition process, the second oblique deposition process, and the third oblique deposition process are performed continuously in a processing chamber, and further including changing a direction of depositing the mask material to switch from the first oblique deposition process to the second oblique deposition process and to switch from the second oblique deposition process to the third oblique deposition process.

Example 16

A method of processing a substrate that includes: patterning a photoresist deposited over a substrate using a lithographic process, the patterned photoresist defining initial openings, the initial openings having a first side and an opposite second side along a first direction; loading the substrate in a processing chamber; within the processing chamber, performing a first oblique gas cluster ion beam (GCIB) process to preferentially deposit a mask material within the initial openings on the first side; and within the processing chamber, performing a second oblique gas cluster ion beam (GCIB) process to form final openings by preferentially removing a portion of the photoresist, the portion of the photoresist being between the first side and the second side of the initial openings adjacent to each other in a second direction, the mask material remaining over the substrate and separating the final openings along the second direction.

Example 17

The method of example 16, further including: before patterning the photoresist, forming an underlying layer over the substrate; depositing the photoresist over the underlying layer; and after removing the portion of the photoresist, vertically extend the final openings into the underlying layer by etching the underlying layer using the mask material as an etch mask.

Example 18

The method of one of examples 16 or 17, where the first oblique GCIB process includes: forming a first GCIB from a first process gas including a precursor for the mask material in the processing chamber; and exposing the substrate to the first GCIB with a first angle such that the first GCIB impinges on the first side, and where the second oblique GCIB process includes: forming a second GCIB from a second process gas in the processing chamber; and exposing the substrate to the second GCIB with a second angle such that the second GCIB impinges on the second side.

Example 19

The method of one of examples 16 to 18, further including switching from the first GCIB process to the second GCIB process by replacing the first process gas with the second process gas and switching from the first angle to the second angle.

Example 20

The method of one of examples 16 to 19, where tip-to-tip critical dimensions (T2T CDs) of the initial openings has a first standard deviation, where T2T CDs of the final openings has a second deviation, and where the first standard deviation is greater than the second standard deviation.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   receiving a patterned photoresist formed over the substrate, the patterned photoresist defining initial openings, each of the initial openings comprising a first side and an opposite second side along a first direction;
   depositing a mask material preferentially on the first side within the initial openings using an oblique deposition process performed at a first angle inclined from the first side; and
   removing a portion of the patterned photoresist using an oblique etch process performed at a second angle inclined from the opposite second side, the mask material and a remaining portion of the patterned photoresist defining further openings.

2. The method of claim 1, wherein the receiving the patterned photoresist formed over the substrate comprises:
   forming an underlying layer over the substrate;
   depositing a photoresist over the underlying layer; and
   patterning the photoresist using a lithographic process.

3. The method of claim 2, wherein the lithographic process comprises an extreme UV (EUV) single exposure.

4. The method of claim 3, wherein tip-to-tip critical dimensions (T2T CDs) of the further openings are less than an optical resolution of the EUV single exposure.

5. The method of claim 2, wherein the further openings are final openings, the method further comprising
   vertically extending the final openings into the underlying layer by etching the underlying layer using the mask material as an etch mask.

6. The method of claim 1, further comprising, before removing the portion of the patterned photoresist, performing an anisotropic etch process to remove a portion of the mask material that is not on the first side.

7. The method of claim 6, wherein the initial openings comprise a residue of the photoresist at a bottom of the initial openings, and the method further comprising, after depositing the mask material within the initial openings before removing the portion of the patterned photoresist, removing the residue using an etch process.

8. The method of claim 1, wherein the oblique deposition process or the oblique etch process comprises a particle beam process.

9. The method of claim 1, wherein tip-to-tip critical dimensions (T2T CDs) of all of the initial openings of the substrate have a first standard deviation, wherein T2T CDs of all of the further openings of the substrate have a second standard deviation, and wherein the first standard deviation is greater than the second standard deviation.

10. The method of claim 1, wherein tip-to-tip critical dimensions (T2T CDs) of the further openings are between 0.1 nm and 5 nm, and wherein 3σ value of T2T CDs of the further openings is less than 3 nm.

11. The method of claim 1, wherein the patterned photoresist comprises an organic photoresist and the mask material comprises a dielectric material.

12. The method of claim 1, wherein the initial openings further comprise a third side and an opposite fourth side along a second direction perpendicular to the first direction, the method further comprising depositing the mask material within the initial openings on the third side or the opposite fourth side using another oblique deposition process, the another oblique deposition process being performed at a third angle inclined from the third side or at a fourth angle inclined from the opposite fourth side.

13. The method of claim 12, wherein the initial openings have no residue of the patterned photoresist at a bottom of the initial openings.

14. A method of processing a substrate, the method comprising:
   forming initial recesses in a layer of an organic material deposited over the substrate, each of the initial recesses having a rectangular shape with four sides;
   depositing a mask material within the initial recesses on a first side of the four sides using a first oblique deposition process;
   depositing the mask material within the initial recesses on a second side of the four sides using a second oblique deposition process, the second side being opposite of the first side;
   depositing the mask material within the initial recesses on a third side of the four sides using a third oblique deposition process, wherein the first, the second, and the third oblique deposition processes are performed at angles of incident inclined from the first, the second, and the third side, respectively; and
   forming final recesses by removing a portion of the organic material using an oblique etch process, the oblique etch process being controlled to direct etchants to a fourth side of the four sides, being selective to the mask material, and being performed at an angle of incident inclined from the fourth side, the mask material remaining over the substrate and separating the final recesses.

15. The method of claim 14, wherein the initial recesses comprise a residue of the organic material at a bottom of the initial recesses, and the method further comprising, after depositing the mask material within the initial recesses on the first side and the second side and before depositing the mask material within the initial recesses on the third side, removing the residue using an etch process.

16. The method of claim 15, the etch process comprises a plasma etch process selective to the mask material, wherein the mask material provides protections of the first side and the second side during the etch process.

17. The method of claim 14, wherein the first oblique deposition process, the second oblique deposition process, and the third oblique deposition process are performed continuously in a processing chamber, and the method further comprising changing a direction of depositing the mask material to switch from the first oblique deposition process to the second oblique deposition process and to switch from the second oblique deposition process to the third oblique deposition process.

18. A method of processing a substrate, the method comprising:
   patterning a photoresist deposited over the substrate using a lithographic process, the patterned photoresist defining initial openings, the initial openings having a first side and an opposite second side along a first direction;
   loading the substrate in a processing chamber;
   within the processing chamber, performing a first oblique particle beam process to preferentially deposit a mask material within the initial openings on the first side; and within the processing chamber, performing a second oblique particle beam process to form further openings by preferentially removing a portion of the photoresist, the portion of the photoresist being between the first side and the opposite second side of the initial openings adjacent to each other in a second direction, the mask material remaining over the substrate and separating the further openings along the second direction.

19. The method of claim 18, wherein the further openings are final openings, the method further comprising:

before patterning the photoresist, forming an underlying layer over the substrate;

depositing the photoresist over the underlying layer; and after removing the portion of the photoresist, vertically extending the final openings into the underlying layer by etching the underlying layer using the mask material as an etch mask.

20. The method of claim 18, wherein the first oblique particle beam process comprises:

forming a first particle beam from a first process gas comprising a precursor for the mask material in the processing chamber; and exposing the substrate to the first particle beam with a first angle such that the first particle beam impinges on the first side, and wherein the second oblique particle beam process comprises:

forming a second particle beam from a second process gas in the processing chamber; and exposing the substrate to the second particle beam with a second angle such that the second particle beam impinges on the opposite second side.

21. The method of claim 20, further comprising switching from the first oblique particle beam process to the second oblique particle beam process by replacing the first process gas with the second process gas and switching from the first angle to the second angle.

22. The method of claim 18, wherein tip-to-tip critical dimensions (T2T CDs) of the initial openings have a first standard deviation, wherein T2T CDs of the further openings have a second standard deviation, and wherein the first standard deviation is greater than the second standard deviation.

23. The method of claim 18, wherein the initial openings further comprise a third side and an opposite fourth side along a second direction, the second direction being perpendicular to the first direction, and the method further comprising:

after performing the first oblique particle beam process and before performing the second oblique particle beam process, within the processing chamber, performing a third oblique particle beam process to preferentially deposit the mask material within the initial openings on the third side; and after performing the third oblique particle beam process and before performing the second oblique particle beam process, within the processing chamber, performing a fourth oblique particle beam process to preferentially deposit the mask material within the initial openings on the opposite fourth side.

24. The method of claim 23, wherein the initial openings comprise a residue of the photoresist at a bottom of the initial openings, and the method further comprising, after depositing the mask material within the initial openings, removing the residue using an etch process.

25. The method of claim 18, further comprising, before performing the second oblique particle beam process, performing an anisotropic etch process to remove a portion of the mask material that is not on the first side.

* * * * *

UNITED STATES PATENT AND TRADEMARK OFFICE
CERTIFICATE OF CORRECTION

| | |
|---|---|
| PATENT NO. | : 12,272,559 B2 |
| APPLICATION NO. | : 17/735800 |
| DATED | : April 8, 2025 |
| INVENTOR(S) | : Akiteru Ko |

It is certified that error appears in the above-identified patent and that said Letters Patent is hereby corrected as shown below:

In the Claims

In Column 15, Line 61, Claim 10:
Change "0.1 nm and 5 nm, and wherein 30 value of T2T CDs of the"
To --0.1 nm and 5 nm, and wherein 3σ value of T2T CDs of the--

Signed and Sealed this
Third Day of June, 2025

Coke Morgan Stewart
*Acting Director of the United States Patent and Trademark Office*